US005152057A

United States Patent [19]

Murphy

[11] Patent Number: 5,152,057
[45] Date of Patent: Oct. 6, 1992

[54] MOLDED INTEGRATED CIRCUIT PACKAGE

[75] Inventor: James V. Murphy, Warwick, R.I.

[73] Assignee: Mold-Pac Corporation, West Warwick, R.I.

[21] Appl. No.: 564,406

[22] Filed: Aug. 8, 1990

Related U.S. Application Data

[63] Continuation-in-part of Ser. No. 272,074, Nov. 16, 1988, which is a continuation-in-part of Ser. No. 121,568, Nov. 17, 1987.

[51] Int. Cl.$^5$ .................... H01R 43/00; H01L 23/02
[52] U.S. Cl. ...................................... 29/883; 174/52.4; 29/884
[58] Field of Search ............... 174/52.4, 52.3, 52.2, 174/52.1; 357/70, 72, 74; 29/854, 857, 858, 856, 861, 848, 849, 850, 851, 852, 853, 855, 883, 884; 228/173.1, 180.2, 903, 904

[56] References Cited

U.S. PATENT DOCUMENTS

| | | | |
|---|---|---|---|
| 3,404,319 | 10/1968 | Tsuji et al. | 174/52.4 |
| 3,469,684 | 9/1969 | Keady et al. | 206/59 |
| 4,195,193 | 3/1980 | Grabbe et al. | 174/52.4 |
| 4,393,581 | 7/1983 | Cherian | 29/827 |
| 4,513,355 | 4/1985 | Schroeder et al. | 361/403 |
| 4,554,404 | 11/1985 | Gilder, Jr. et al. | 174/52.4 |
| 4,611,398 | 9/1986 | Eames et al. | 29/841 |
| 4,618,739 | 10/1986 | Theobald | 174/52.4 |
| 4,629,824 | 12/1986 | Gilder, Jr. et al. | 174/52.4 |
| 4,640,010 | 2/1987 | Brown | 29/832 |
| 4,653,174 | 3/1987 | Gilder, Jr. et al. | 29/574 |
| 4,663,650 | 5/1987 | Gilder, Jr. et al. | 357/70 |
| 4,663,651 | 5/1987 | Gilder, Jr. et al. | 357/70 |
| 4,677,526 | 6/1987 | Muehling | 361/386 |
| 4,750,092 | 6/1988 | Wether | 361/400 |
| 4,766,478 | 8/1988 | Dennis | 357/70 |
| 4,816,426 | 3/1989 | Bridges et al. | 437/207 |
| 4,820,658 | 4/1989 | Gilder, Jr. et al. | 437/209 |
| 4,872,260 | 10/1989 | Johnson et al. | 29/827 |

FOREIGN PATENT DOCUMENTS

A30232837 8/1987 European Pat. Off. .

OTHER PUBLICATIONS

Murphy, James V. U.S. Ser. No. 07/252.074, filed Nov. 16, 1988 entitled "Molded-In Lead Frames".
AMP, Premolded Plastic Chip Carrier, pp. 105–107.
Design News, "Insert-Molded Stamping Simplifies Manufacture of Terminal Block, Two-stage molding process cuts terminal block's cost 80%", pp. 114–116.
Dietech, drawing Nos. CZ-5700, CZ-5713, CZ-5700, & CZ-5701, "Die-Tech's Multi-Function, High Performance Chip Carrier"; Die-Tech's Advanced Technologies-One Source for Solutions.
EG&G Wakefield Engineering, Deltem TM Composite Heat Sinks Introduce A New Dimension To Electronics Heat Transfer (4 pages).
Electronic Packaging & Production, advertisement for Autosplice, p. 48.
IBM Technical Disclosure Bulletin, "Heat Dissipator Assemblies", vol. 8, No. 10, Mar., 1966, pp. 1460–1461.
ISHN'88 Proceedings, FIG. 1 & FIG. 2, p. 186.

(List continued on next page.)

*Primary Examiner*—Leo P. Picard
*Assistant Examiner*—Bot Lee Ledynh
*Attorney, Agent, or Firm*—Fish & Richardson

[57] ABSTRACT

A plastic package that includes a cavity for holding an integrated circuit die. The package also includes several singel-piece leads that each have bonding pad area on one end and an area for connecting to external circuitry on the other end. The package's plastic body supports the leads, separates them from each other, and includes a ridge that substantially encircles the cavity and separates the bonding pad areas from the cavity. The package may be made by forming a first portion including alignment protrusions sized to receive lead bonding pad ends, placing the leads with their bonding pads so that they are spaced apart by the protrusions, and securing them, preferably by supplying heat to the protrusions. A second portion of the package may then be molded around the first portion, the leads, and, preferably, a heat sink.

2 Claims, 7 Drawing Sheets

OTHER PUBLICATIONS

Jedec Solid State Products Outlines, drawings entitled Tape Quad Flat Pack, sheets 5, 4, 3 & 1 of 10.
Kyocera, drawing Nos., KD-84127, KD-84136 1/2, KD-84130 1/2.
M. R, Leibowitz, "Plastic gives cermaic a run for the money", EDN News, Feb., 1988.
B. Werther, "Molded Thermoplastics For Pin-Grid Array Chip Packaging", pp. 267-280.
Narumi Technical Ceramics, Cerquad Dimension Table.
National Semiconductor, Plastic Quad Flat Pack (PQFP) Technology, 1987.
Patent Abstract of Japan, vol. 10, No. 186 (E-416)[2242], Jun. 28, 1986.
Patent Abstracts of Japan, vol. 10, No. 213 (E-422)[2269], Jul. 25, 1986.
Plasmetex brochure (4 pages).
Plasticorp brochure (1 page).
Proceedings of the 1984 International Symposium on Microelectronics, "Isomatrix With Matching Photo Metalization Pattern", p. 226, Sep. 17-19, 1984.
Texas Instruments, new product announcement, Plastic Cavity Package (4 pages).
Tricon brochure, "Step Up To Tricon. Every Step Of The Way." (8 pages).
United Technologies Microelectronics Center brochure, "A rad-hard gate array with only one set of standards Miliatry." (1 page).,
Mercel Company, Inc. Brochure (4 pages).

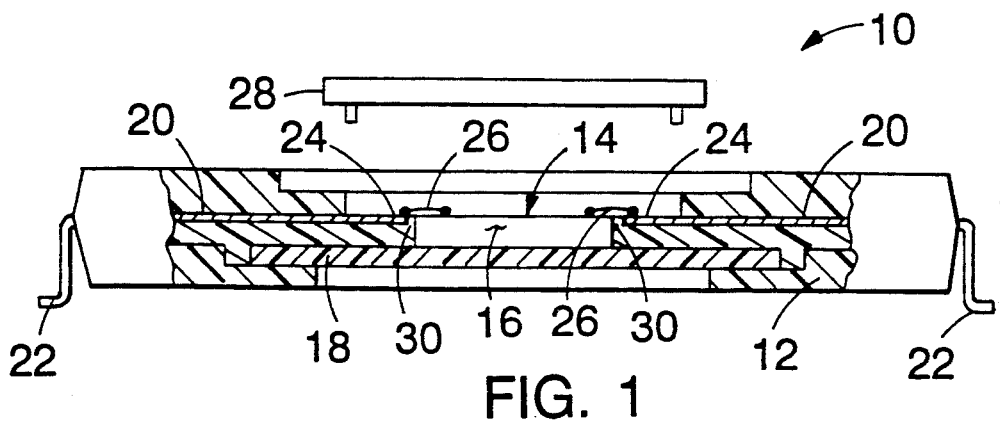
FIG. 1
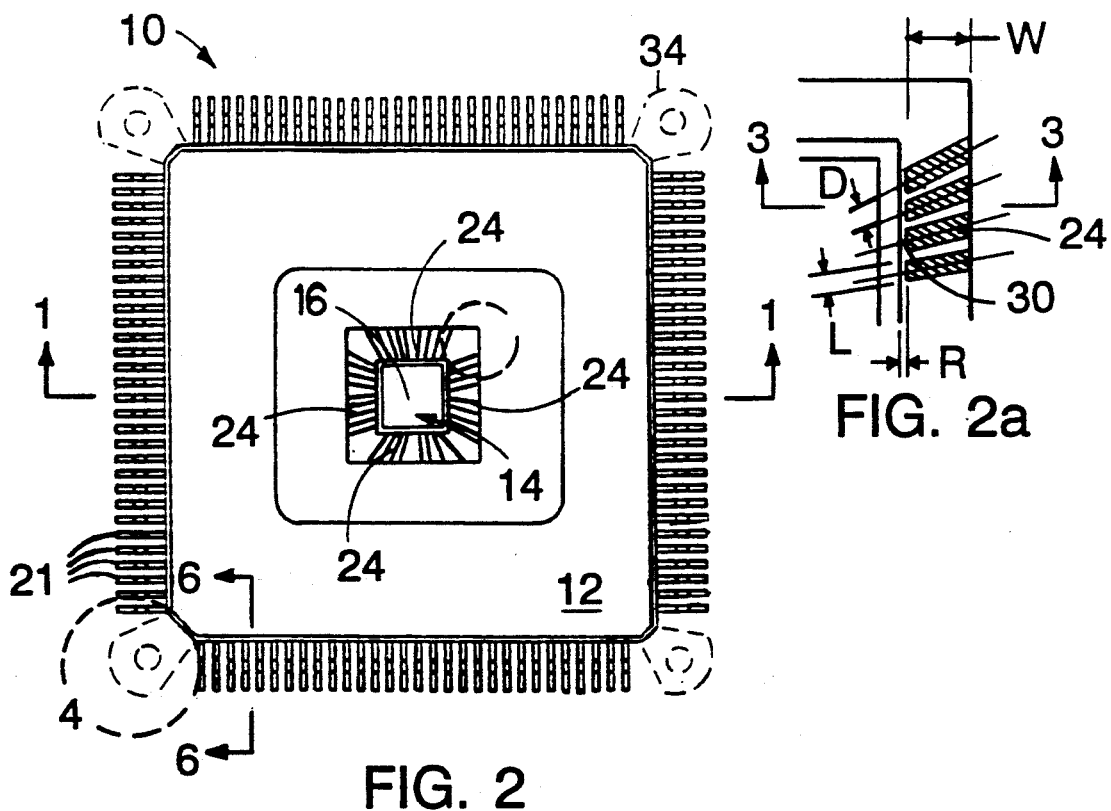
FIG. 2a
FIG. 2
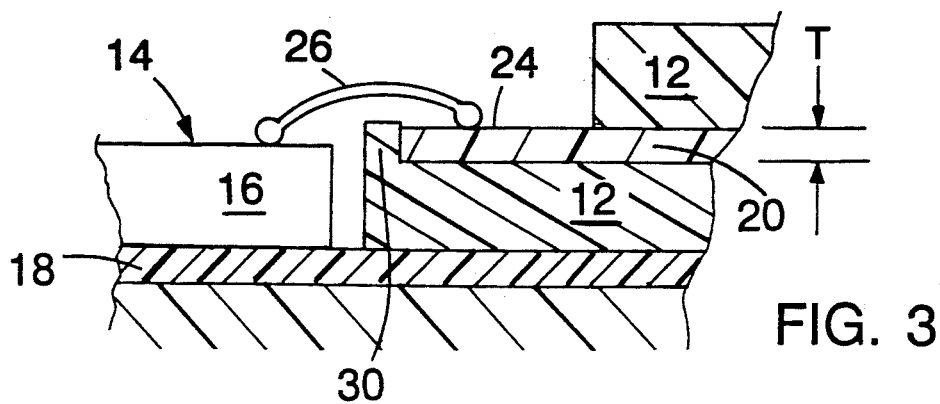
FIG. 3

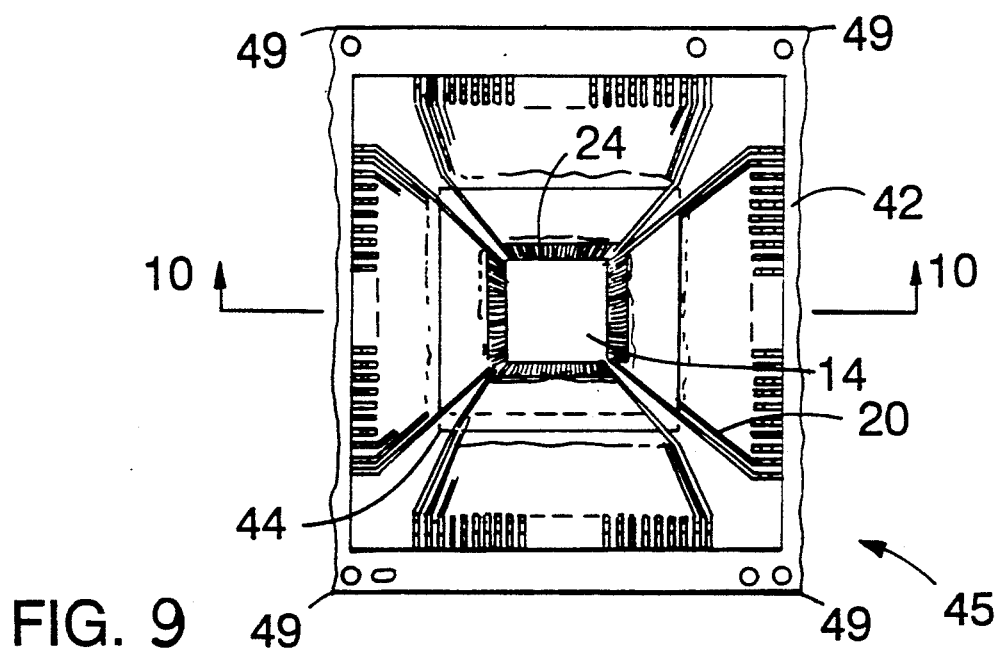
FIG. 9
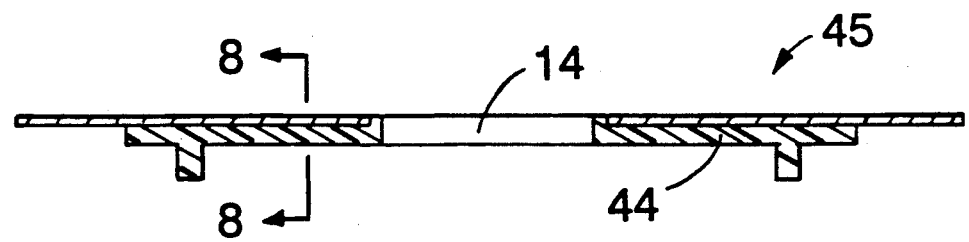
FIG. 10
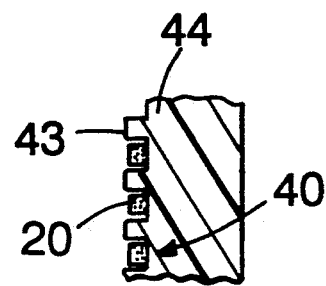 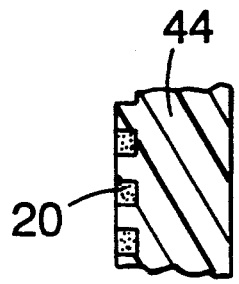
FIG. 11a    FIG. 11b

MOLDED INTEGRATED CIRCUIT PACKAGE

This application is a continuation-in-part of copending U.S. patent application Ser. No. 07/272,074, filed Nov. 16, 1988, entitled "Molded-in Lead Frames," which is a continuation-in-part of Ser. No. 07/121,568, filed Nov. 17, 1987.

BACKGROUND OF THE INVENTION

This invention pertains to packages for integrated circuits.

Integrated circuit dies are generally housed in packages known as chip carriers to protect them from contact with foreign objects, and to provide leads for soldering them to printed circuit boards or other surfaces. Usually, the die is placed in a package with leads and connections are made from the die to the leads using small bonding wires. During assembly, several of these leads may be provided in one or more aggregate parts, called lead frames.

A lead frame is a piece of stamped or etched sheet metal that includes several leads that are connected together with removable ribs. These ribs hold the plurality of leads together during assembly of the package and thus simplify positioning of the leads. Once the package is assembled, the leads are separated by removing the ribs. Lead frames may be made by stamping or by etching, if the metal is thin enough with respect to the separation between leads.

It is known to allow epoxy to cure around a die and lead-frame at low pressures. It is also known to make this lower portion by molding lead frames with a central rib into a plastic body and then punching out the central rib along with a portion of the plastic body. An assembly method of this type is shown in U.S. Pat. No. 4,195,193 to Grabbe et al. entitled "Lead Frame and Chip Carrier Housing".

SUMMARY OF THE INVENTION

In general, the invention features a molded plastic integrated-circuit package in which the leads of a lead frame are kept spaced apart during the molding process by first installing the lead frame on a first-shot molded portion. Preferably, the first-shot molded portion has alignment protrusions that extend between the leads of the lead frame, keeping them spaced apart during a second molding step, in which plastic is molded around the assembled lead frame and first-shot molded portion.

In preferred embodiments, the invention has further features: The protrusions may be deformed around the leads by application of heat, prior to the second molding step. A plastic ridge may separate the wire-bonding ends of the leads from the die cavity in which the integrated circuit is placed; the ridge may be formed in the first-shot molded portion, and the central rib of the lead frame removed prior to assembly of the lead frame and first-shot molded portion. The ridge helps to prevent bond wires from touching adjacent bond wires or bonding pad areas. A heat sink may be installed prior to the second molding step, to allow a better seal (although not hermetic) between the heat sink and the plastic body. The alignment protrusions in the first-shot molded portion may be either ridges extending generally parallel with the leads or spaced apart bumps. The package may be made of a high molding pressure plastic such as polyphenylene sulfide. The leads, of which their can be 80 or more, may be less than 10 thousandths of an inch thick, separated by less than 7 thousandths of an inch, and may be plated on all surfaces. The package may include a cover that is preferably attached with epoxy. The package may also include a second set of single-piece leads substantially disposed in a plane parallel to that of the first set. The package of the invention may also include lead locator ribs and/or handling ears with one of the ears including a locator peg for orienting the package.

The package of the invention may easily be assembled by the user without any expensive equipment other than that normally used to perform the wire bonding operation; the cover may be simply glued with epoxy to the top of the package. The combination of simple assembly, low cost material and reliably plated bonding pad areas makes the part useful in making small to medium-sized batches or prototypes of integrated circuits. The two-shot molding process also allows for the use of high molding pressure plastics with thin lead frames without causing the leads to move ("swim") during molding. Such lead movement can cause inaccurate positioning of the leads in the final package, making it unusable. Thin lead frames are inexpensive, and can be cut to a very narrow spacing, allowing high lead counts in a plastic package. The bonding areas of the lead frame used in the package of the invention may be cut before they are plated, preventing corrosion of exposed portions of these areas. The leads may also be cut more precisely and cleanly if they are cut before they are assembled into the package. Some high molding pressure plastics tend to withstand soldering well, have desirable dielectric properties, resist moisture well, and may be molded in a very short period of time.

Other features and advantages of the invention will become apparent from the following description of a preferred embodiment and from the claims.

DESCRIPTION OF THE PREFERRED EMBODIMENT

FIG. 1 shows a cross section of the package of the invention with its cover in a removed position and a die installed.

FIG. 2 is a top view of the package of the invention with its cover removed to show the bonding pad areas and the die in its cavity. FIG. 2 also includes a magnified portion showing the detail of the bonding pad areas surrounding the die cavity.

FIG. 3 is a cross section of the magnified area of FIG. 2, with a bond wire added between a bonding pad area and the die.

FIG. 9 is a top view of the first-shot portion of the package of the invention with its associated lead frame placed such that its bonding pad areas are sitting in the grooves of the first-shot portion.

FIG. 10 is a cross-section of the first-shot portion and lead frame in the same stage of assembly as is shown in FIG. 9.

FIG. 11a and FIG. 11b include two sub-figures of a partial cross-section of the first-shot portion showing the leads before and after heat is applied to secure them to the first-shot portion.

Figure 12:
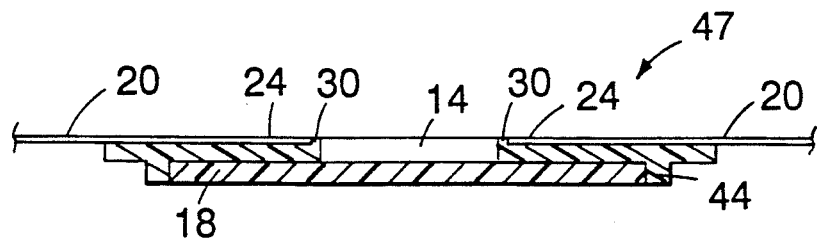

FIG. 12 shows the first-shot portion with the leads secured thereto and the heat sink in place, ready for the second-shot molding operation.

Figure 13:
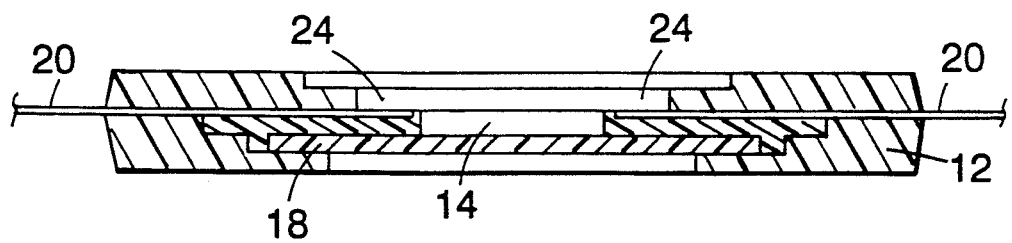

FIG. 13 is a cross-sectional view of the package of the invention after the second-shot molding operation and before the leads are bent.

Figure 14:
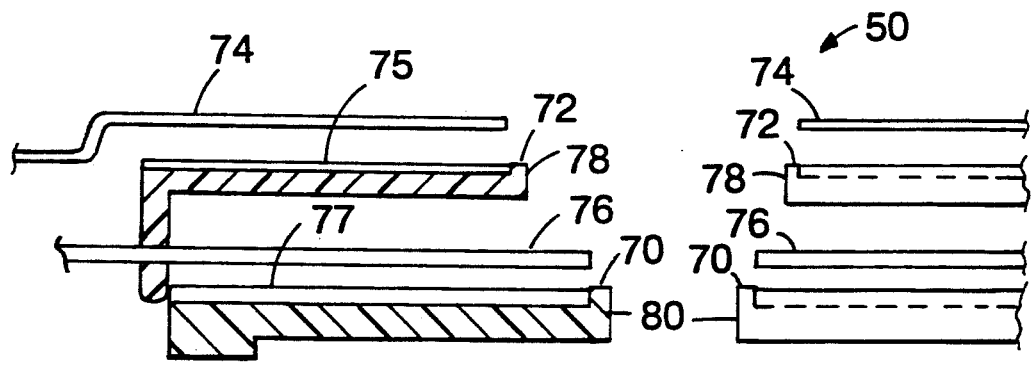

FIG. 14 is a partial exploded cross-sectional view of a two-tier embodiment of the invention.

Figure 15:
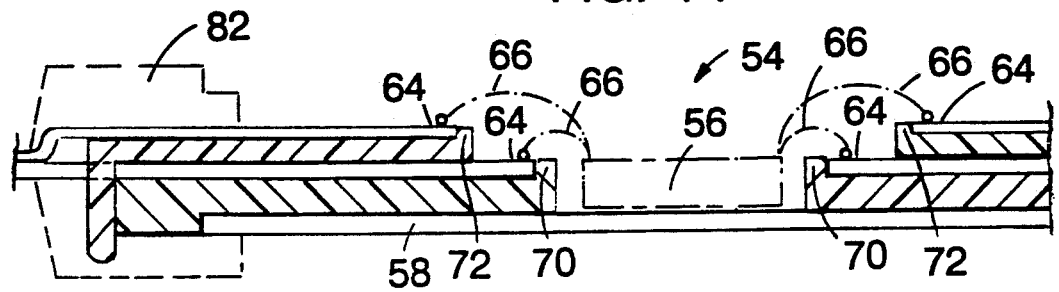

FIG. 15 is a partial assembled cross-sectional view of the two-tier embodiment of FIG. 14.

Figure 16:
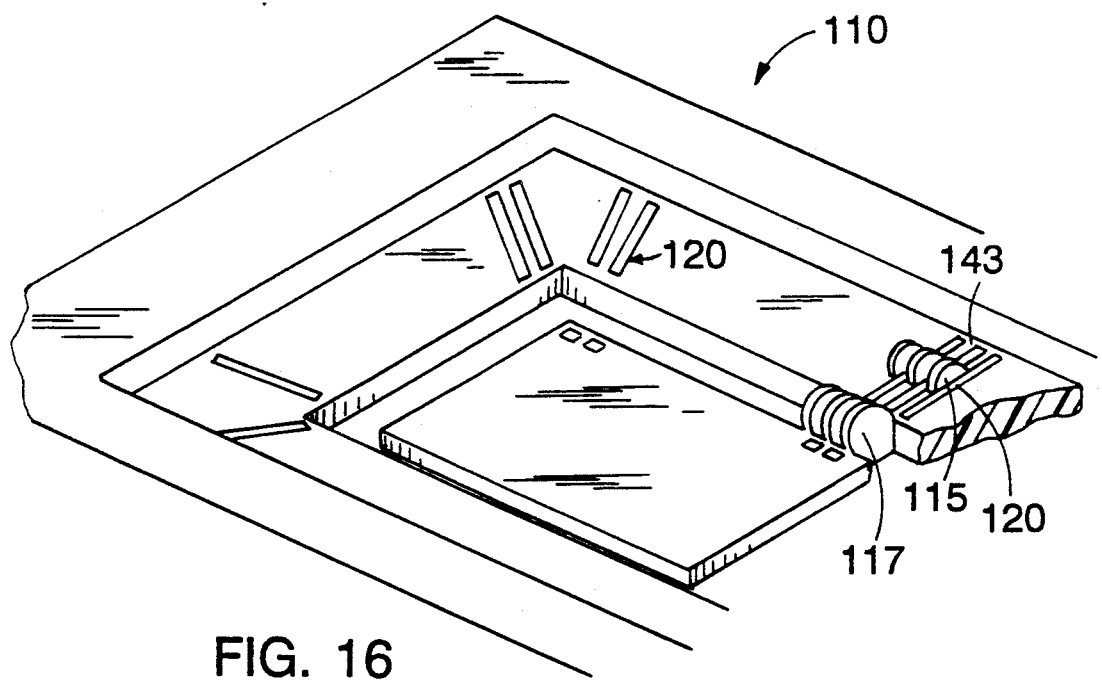

FIG. 16 is a partial perspective view of an embodiment including ridges with bumps for separating the bonding wires and guiding the lead frame during insertion.

Figure 17:
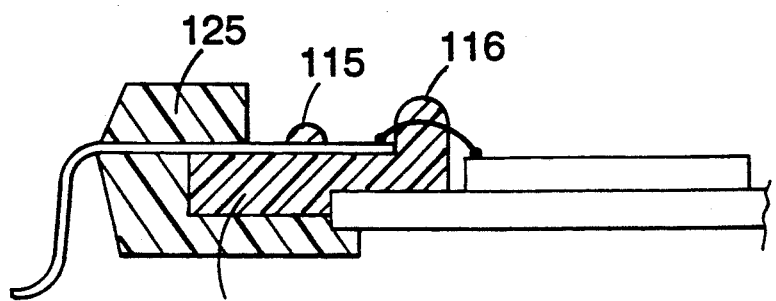

FIG. 17 is a partial cross-section of the embodiment of FIG. 16, taken along the longitudinal axis of the bonding pad area of a lead.

Figure 18A:
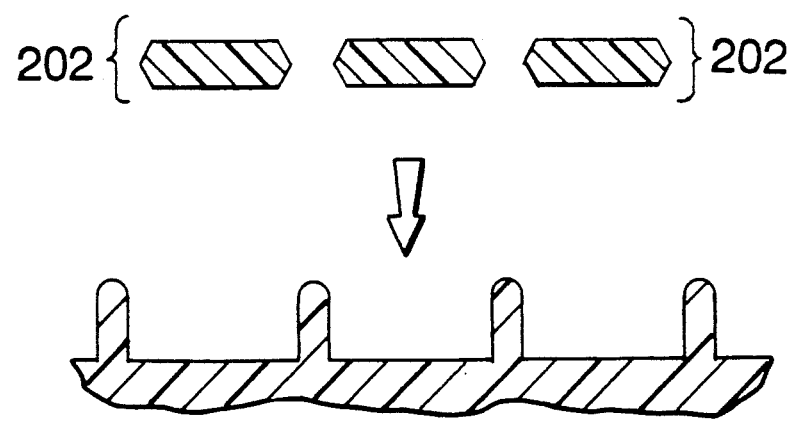
Figure 18B:
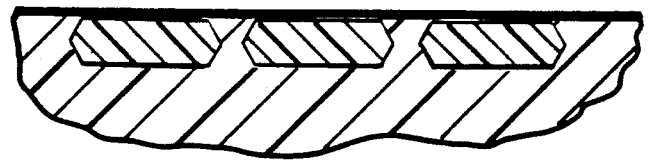

FIG. 18a and 18b include two sub-figures of a partial cross-section of a first-shot portion showing leads manufactured by etching before and after heat is applied to secure them to the first-shot portion.

Figure 19:
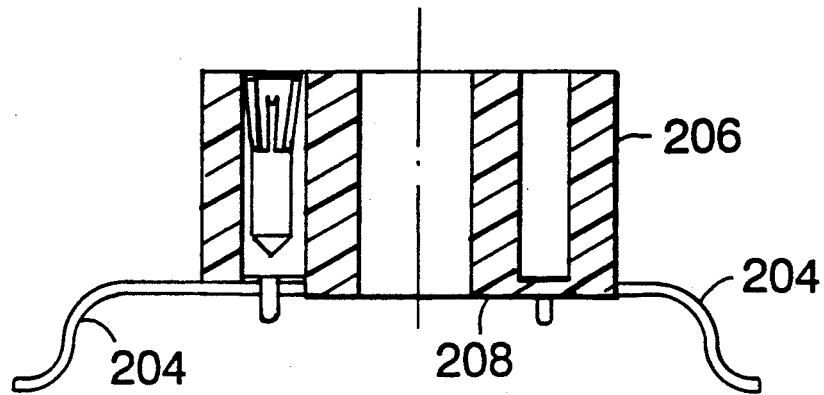

FIG. 19 is an elevation view, cross sectioned in part at the center of a lead and in part between leads, showing another embodiment of the invention in which a lead frame is retained to a plastic body by protrusions extending downward from the body between the leads.

Referring to FIG. 1, an integrated circuit package 10 is shown. The package type of this embodiment is known in the art as a plastic quad flat package or PQFP. It should be noted that the invention is not limited to this type of package and may be applied to other types of package, for example, pin grid arrays (PGA), plastic leadless chip carriers (PLCC), and dual in-line packages (DIP). The package of this embodiment has 100 leads.

The package 10 includes a plastic body 12 that may be covered with a cover 28, and that has leads 20 which protrude out of the sides of the package. These are bent to form a connection area 22 that may be soldered to a circuit surface such as a printed circuit board, or that may be inserted into an appropriate socket.

The package provides a cavity 14 for holding a die 16. Each single-piece lead 20 has a wire bonding pad area 24 opposite its connection area 22. These pads provide a surface for wire bonding a short wire 26 between each lead and the die 16. It should be noted that other methods may also be used for connecting the leads and the die. A heat sink 18 is located below the cavity 14 to provide support for the die 16, and to efficiently dissipate heat generated by the die.

Referring to FIGS. 2 and 3, a portion of the plastic body that forms a ridge 30 separates the bonding areas 24 from the cavity 14. This ridge prevents the bonding wires 26 from touching adjacent leads, should they become bent. The ridge's width R is around 15 thousandths of an inch. The ridge is somewhat wider in the center faces of the cavity than it is at the corners thereof. The bonding pad areas 24 are of a width L of about 7 thousandths of an inch, a thickness T of about 6 thousandths, and are separated by a distance D of around 5.5 thousandths. Of course, other dimensions are possible.

Figure 4:
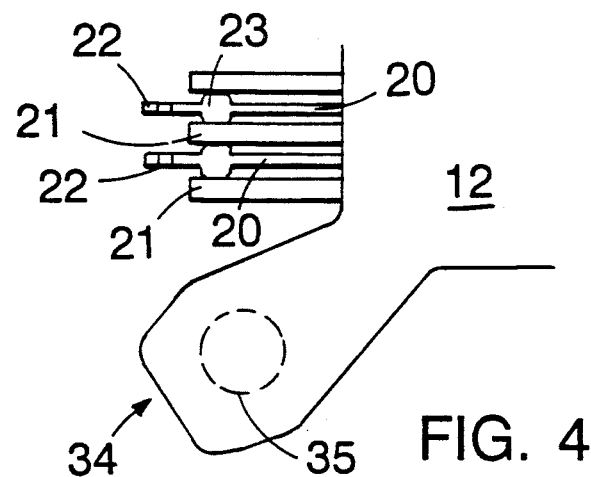
FIG. 4 is a detail of the portion of the package shown in the circle marked "4" in FIG. 2, and shows an optional ear and lead support ribs.
Figure 5:
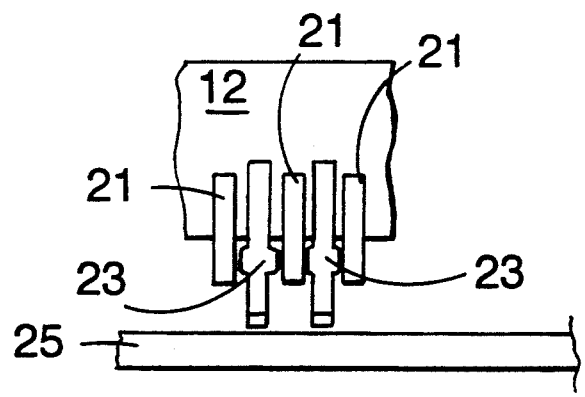
FIG. 5 is a side view of a portion of the package of FIG. 2, shown soldered to a printed circuit board.
Figure 6:
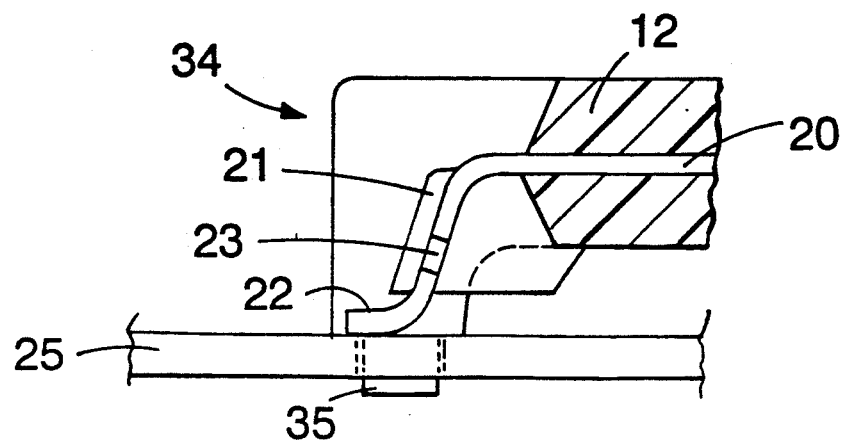
FIG. 6 is a cross-section of a portion of the package of FIG. 2, shown soldered to a printed circuit board.

Referring to FIGS. 2, 4 and 6, optional ears 34 may be provided on the corners of the package. These ears interact with certain storage and handling containers that facilitate handling of the package while protecting its leads. One of these ears may, if desired, be provided with a locator peg 35 that is designed to interact with a hole in a circuit board 25. This peg helps to prevent the package from being accidentally soldered to the board in an incorrect orientation and also helps to align the leads with respect to their associated solder pads.

Referring to FIGS. 2, 4, 5 and 6, optional lead support ribs 21 may be provided between the leads of the package. These ribs help to protect the leads 20 and to keep them rigid, thus maintaining the connection areas 22 in their proper locations.

Figure 7:
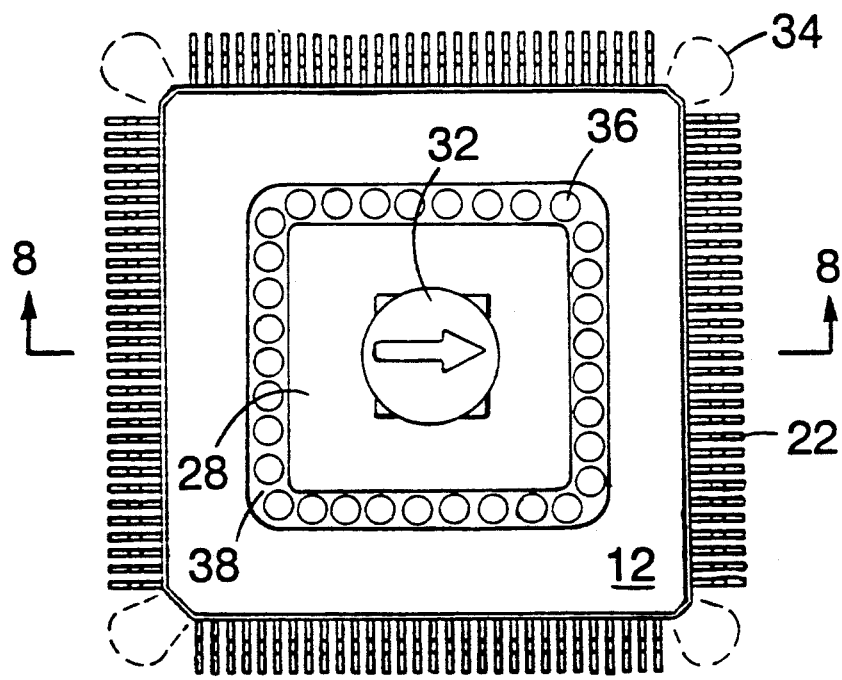
FIG. 7 is a top view of the package of the invention with its cover installed but not yet fixed in place.
Figure 8:
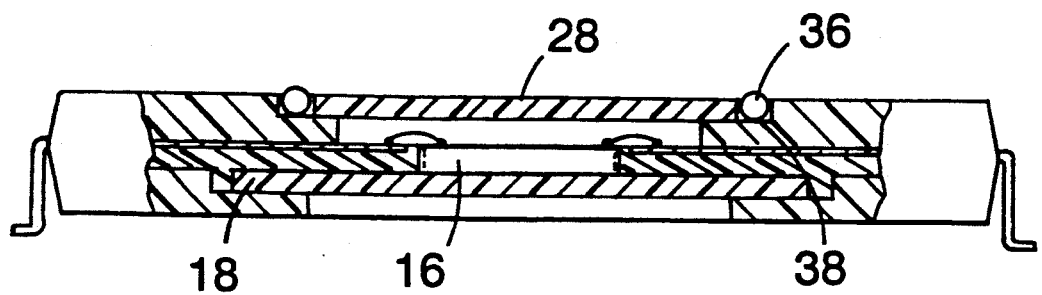
FIG. 8 is a cross-section of the package of the invention with its cover installed but not yet fixed in place.

The package is provided to the user without a cover. The user may then install his or her die and wire bond it to the bonding pad areas. Typically, a silicone gel is then applied to the cavity in order to protect the die from corrosion and to enhance heat transfer from the die to the package. The cover 28 may then be added to the package. As shown in FIGS. 7 and 8, the package may be supplied to the user with epoxy beads 36 that may be melted to fill the channel 38 that remains between the cover and the body 12 of the package. Other attachment methods are, of course, possible. The company's logo 32, or other information may appear on the cover.

FIGS. 9, 10 and 11a show the results of the first assembly operation required in the invention. In this operation, a lead frame 42 is placed into a first-shot molded portion 44 of the package. This portion is shown to include grooves 40 which are spaced to accept the leads in lead frame 42. The grooves are formed during a first molding operation when the portion 44 is injection molded. It should be noted that the ridges 43 between the grooves are somewhat taller than the lead frame and thus extend above the lead frame.

Portion 44 is made by injection-molding of a high molding pressure plastic, glass-filled polyphenylene sulfide (PPS). This plastic resists the high temperatures present in wave soldering, vapor phase soldering and infra-red soldering. It also has a low affinity for moisture and desirable dielectric properties. This plastic must be molded at high pressures and temperatures, however, but the molding operation may be relatively short in duration (e.g., around 15 seconds). A typical molding pressure is between 500 and 800 p.s.i.g.

FIG. 11b shows the first-shot portion of the body after the second operation. The second operation involves the application of heat to the areas between the grooves by pressing on the first-shot portion using a hot metal iron. This application of heat softens the plastic and causes it to surround the leads and thus secure them to the first-shot portion. Since the ridges between the grooves extend beyond the lead frame, there will be a small amount of excess material that will be pressed so as to fill the small voids between the leads and the walls of the grooves.

In performing this operation, the iron is held at a temperature between 425 and 450 degrees fahrenheit, and applied to the first assembly 45 with a force of 30 p.s.i.g.

It should also be noted that the grooves need not be long and channel-shaped. In the embodiment of FIGS. 16 and 17, for example, the ridges 143 include two sets of bumps 115, 117. Bumps 115 from the first set are tapered, being narrower at the top than at the bottom where they are as wide as the distance separating the leads. This is advantageous in that the tapered bumps can assist in the placement of the lead frame by easing them into the channels, and therefore the placement operation can be performed with less demanding tolerances. The bumps 117 in the second set act as partitions between the bonding wires 116 to prevent short-circuits from occurring between these wires.

Both sets of bumps are part of the first-shot portion of the package 123 in FIG. 17. The second-shot portion 125 being molded around the first as will be described later. The bumps 115 of the first set may be partially or fully flattened when heat is applied to the first-shot portion with an iron. Spaces may be left around the bumps and between the leads to accommodate the flow from the melted bumps. Alternatively, these bumps can be left standing, for example, by providing gaps for them in the iron used to seal in the leads. The bumps 117 of the second set are left standing.

Referring to FIG. 18, retention of the leads is enhanced if the leads of the lead frame have some irregularity in surface 202. In the case of lead frames manufactured by conventional etching techniques, this surface has the diamond shaped appearance shown in FIG. 18. This shape tends to provide better retention when the plastic protrusions have been deformed around the leads. Some improved retention of this nature is also possible with stamped lead frames, from the burr that may be left on one surface by stamping, or from irregularity that may be intentionally added in a step subsequent to stamping.

It should be noted that the lead frame can be glued in place in the channels instead of being heat sealed in place. Glue could also be used as a substitute for ridges or bumps, with the glue serving to hold the leads in place during the second-shot molding operation.

A heat sink is then placed on the first-shot portion 44 in the position shown in FIG. 12. It should be noted that the heat sink may be placed on the top or the bottom of the package to yield a "cavity-up", or a "cavity-down" package. Cavity-down packages have the advantage that their heat sinks may be supplemented with external heat sinks. The embodiments shown are all of the cavity-up variety, but it will be apparent that a cavity-down configuration could also be made using the method described herein by inverting the intermediate assembly 47 at this stage of manufacture.

The next step performed is the second molding operation. In this operation, the intermediate assembly 47, comprising the first-shot portion 44, the lead frame 42, and the heat sink 18, is placed within a second mold and plastic is molded around it. This molding operation yields a body 12 that has a heat sink 18 and leads 20 molded into it. (See FIG. 13). The well-embedded molded-in heat sink provides a significant barrier to dust and moisture. This second molding operation also creates the optional ears 34 and ribs 21 if desired.

This second molding operation is also a high pressure operation (i.e., one performed at over 500 p.s.i.g.) involving a high molding pressure plastic. These high pressures do not deform or damage the leads, however, because they are secured in place as described above. Once this second molding is complete, the dam bar, a portion of the lead frame that prevents plastic from seeping out from between the leads during molding, is cut away (not shown).

The corners of the lead frame 49 (FIG. 9) are then removed, and the leads are bent, leaving them in their final shape. In the case of a package with optional lead support ribs 21, the bending operation also serves to press fit the enlarged portion 23 of the lead 22 between the ribs (FIGS. 2, 4, 5, and 6). The remaining outer portions of the lead frame that have held the leads together until this point are then removed. The leads may then be re-plated to protect the areas of metal that are exposed during cutting.

The package now is ready to be shipped with its plastic or plated metal cover and optional adhesive.

FIGS. 14 and 15 show an extension of the process to generate a two-tier package. This two-tier package has the advantage of high lead density. The use of two tiers also allows for the simple construction of PGA packages with multiple rows of leads around their periphery. It is also possible to build these with leads made up of two parts. This could be done by soldering or press fitting pins to portions of lead frame that form the bonding pad areas, for example. My co-pending application No. 07/272,074 entitled "Molded-in Lead Frames" shows construction methods of this type.

To manufacture the two-tier package, two first-shot portions 78, 80 are molded so that each one has groves 75, 77 ending in a ridge 70, 72 for the leads 74, 76 in respective lead frames. These leads are secured into the first-shot portions using a hot iron, as above. The two resulting assemblies are placed in a mold, and the body 82 is completed by molding additional plastic around these assemblies.

The user may then place a die 56 in cavity 54 and bond wires 66 therefrom to two different sets of bonding pad areas 64. Packages with three or more tiers can also be manufactured to accommodate higher lead counts.

Referring to FIG. 19, there is shown another embodiment in which the invention is applied to a device different from an integrated circuit package, in this case an adapter. The lead frame 204 is secured to the plastic body 206 of the adapter by the same arrangement of protrusions 208 that extend between the leads and are subsequently deformed to retain the leads. In this embodiment, a second-shot mold is not required.

Other embodiments are within the following claims. For example, the two-shot molding technique could be applied to the embodiments disclosed in my pending applications entitled "Molded-In Lead Frames", Ser. Nos. 07/121,568 and 07/272,074 (both hereby incorporated by reference), including PGA packages in which the leads of a lead frames have holes through which pins are inserted.

What is claimed is:

1. A method of manufacturing a device for making connections to a circuit board, said method including
    molding a plastic body with a plurality of protrusions sized and positioned for mating with an arrangement of leads cut from a lead frame, said leads being supported at their outer ends by an outer frame portion of said lead frame and being unsupported at their inner ends;
    assembling said leads to said plastic body with said protrusions extending between said unsupported inner ends of said leads and maintaining separation between said inner ends of said leads, and
    deforming said protrusions subsequent to assembly to retain said leads on said plastic body.

2. The method of claim 1, wherein said step of deforming is performed by supplying heat to said protrusions to cause flow of the protrusions to an extent that retains said leads.

* * * * *